United States Patent
Song et al.

(10) Patent No.: US 11,069,758 B2
(45) Date of Patent: Jul. 20, 2021

(54) ORGANIC LIGHT-EMITTING DIODE DISPLAY SUBSTRATE, METHOD FOR MANUFACTURING ORGANIC LIGHT-EMITTING DIODE DISPLAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Song, Beijing (CN); Liangchen Yan, Beijing (CN); Ce Zhao, Beijing (CN); Dongfang Wang, Beijing (CN); Bin Zhou, Beijing (CN); Yuankui Ding, Beijing (CN); Jun Liu, Beijing (CN); Yingbin Hu, Beijing (CN); Wei Li, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/436,201

(22) Filed: Jun. 10, 2019

(65) Prior Publication Data
US 2020/0035767 A1      Jan. 30, 2020

(30) Foreign Application Priority Data

Jul. 27, 2018   (CN) .......................... 201810845866.0

(51) Int. Cl.
*H01L 27/32* (2006.01)
*H01L 51/00* (2006.01)
(Continued)

(52) U.S. Cl.
CPC ...... *H01L 27/3246* (2013.01); *H01L 51/0096* (2013.01); *H01L 51/5206* (2013.01);
(Continued)

(58) Field of Classification Search
CPC .......................... H01L 27/3246; H01L 51/56
(Continued)

(56) References Cited

U.S. PATENT DOCUMENTS

| 7,695,759 B2 | 4/2010 | Kumagai |
| 8,049,413 B2 | 11/2011 | Kumagai |

(Continued)

FOREIGN PATENT DOCUMENTS

| CN | 101090132 A | 12/2007 |
| CN | 107403823 A | 11/2017 |

OTHER PUBLICATIONS

First Office Action, including Search Report, for Chinese Patent Application No. 201810845866.0, dated Mar. 30, 2020, 10 pages.

*Primary Examiner* — Jonathan Han
(74) *Attorney, Agent, or Firm* — Westman, Champlin & Koehler, P.A.

(57) ABSTRACT

The present disclosure relates to the display technology, and provides an OLED display substrate, a method for manufacturing the OLED display substrate and a display device. The method includes: forming pixel definition layer transition patterns with metal; and oxidizing the pixel definition layer transition patterns to form an insulative pixel definition layer.

9 Claims, 1 Drawing Sheet

(51) Int. Cl.
*H01L 51/52* (2006.01)
*H01L 51/56* (2006.01)

(52) U.S. Cl.
CPC ........ *H01L 51/56* (2013.01); *H01L 2227/323* (2013.01); *H01L 2251/5315* (2013.01)

(58) Field of Classification Search
USPC ..................................... 257/88, 100; 438/29
See application file for complete search history.

(56) References Cited

U.S. PATENT DOCUMENTS

| | | | |
|---|---|---|---|
| 2005/0142974 A1* | 6/2005 | Lee ..................... | H01L 51/5203 |
| | | | 445/24 |
| 2007/0263164 A1 | 11/2007 | Kumagai | |
| 2009/0072226 A1 | 3/2009 | Koo et al. | |
| 2010/0090933 A1 | 4/2010 | Kumagai | |
| 2010/0258833 A1* | 10/2010 | Okumoto ............ | H01L 51/5209 |
| | | | 257/98 |
| 2016/0254476 A1* | 9/2016 | Park .................... | H01L 51/5209 |
| | | | 257/40 |
| 2016/0276615 A1* | 9/2016 | Kitabayashi ........ | H01L 51/5265 |
| 2017/0170244 A1* | 6/2017 | Kobayashi .......... | H01L 51/5012 |
| 2017/0301889 A1* | 10/2017 | Hayashida .......... | H01L 27/3246 |

\* cited by examiner

ORGANIC LIGHT-EMITTING DIODE
DISPLAY SUBSTRATE, METHOD FOR
MANUFACTURING ORGANIC
LIGHT-EMITTING DIODE DISPLAY
SUBSTRATE AND DISPLAY DEVICE

CROSS-REFERENCE TO RELATED
APPLICATION

The present application claims a priority of the Chinese patent application No. 201810845866.0 filed on Jul. 27, 2018, which is incorporated herein by reference in its entirety.

TECHNICAL FIELD

The present disclosure relates to the field of display technology, in particular to an organic light-emitting diode (OLED) display substrate, a method for manufacturing OLED display substrate, and a display device.

BACKGROUND

Light beam generated by a top-emission OLED may exit in a direction away from a base substrate. A light-emitting area is not affected by a back plate with a thin film transistor (TFT) driving circuit, so the top-emission OLED has a larger aperture ratio, i.e., a larger ratio of the light-emitting area to a pixel area, as compared with a conventional bottom-emission OLED. Due to the larger aperture ratio, a smaller driving current may be supplied to the top-emission OLED as compared with the bottom-emission OLED, when an identical brightness value is to be provided, so it is able to prolong a service life of the OLED. In addition, in the case of same luminous efficiency and same light-emitting area, it is able to provide a display panel having the top-emission OLED with a smaller pixel area, i.e., it is able to increase a resolution of the display panel when the top-emission OLED is adopted. Hence, the top-emission OLED has currently become a research focus.

SUMMARY

In one aspect, the present disclosure provides in some embodiments a method for manufacturing an OLED display substrate, including: forming pixel definition layer transition patterns with metal; and oxidizing the pixel definition layer transition patterns to form an insulative pixel definition layer.

In a possible embodiment of the present disclosure, the forming the pixel definition layer transition patterns with metal includes forming the pixel definition layer transition patterns and at least a part of an anode with metal through a one-step patterning process.

In a possible embodiment of the present disclosure, the forming the pixel definition layer transition patterns and at least a part of the anode with metal includes: forming a metal layer; and patterning the metal layer to form a first metal pattern and a plurality of metal banks arranged on the first metal pattern, spaced apart from each other and defining a plurality of pixel opening regions. The first metal pattern is a part of the anode, and the metal banks are the pixel definition layer transition patterns.

In a possible embodiment of the present disclosure, the forming the pixel definition layer transition patterns and at least a part of the anode with metal further includes, prior to forming the metal layer, forming a second transparent conductive pattern. An orthogonal projection of the second transparent conductive pattern onto a plane where the first metal pattern is located coincides with the first metal pattern.

In a possible embodiment of the present disclosure, the forming the pixel definition layer transition patterns and at least a part of the anode with metal further includes, subsequent to forming the metal layer, forming third transparent conductive patterns in the pixel opening regions respectively.

In a possible embodiment of the present disclosure, the forming the pixel definition layer transition patterns and at least a part of the anode with metal includes: forming a metal layer; and patterning the metal layer to form a first metal pattern including first portions of the anode and the pixel definition layer transition patterns. The first portions and the pixel definition layer transition patterns are arranged alternately, and an upper surface of each first portion is flush with an upper surface of each pixel definition layer transition pattern.

In a possible embodiment of the present disclosure, the forming the pixel definition layer transition patterns and at least a part of the anode with metal further includes, prior to forming the metal layer, forming a second transparent conductive pattern. An orthogonal projection of the second transparent conductive pattern onto a plane where the first metal pattern is located coincides with the first metal pattern.

In a possible embodiment of the present disclosure, the forming the pixel definition layer transition patterns and at least a part of the anode with metal further includes, subsequent to forming the metal layer, forming third transparent conductive patterns on the first portions. The oxidizing the pixel definition layer transition patterns to form the insulative pixel definition layer includes oxidizing each pixel definition layer transition pattern no covered by the corresponding third transparent conductive pattern to acquire the insulative pixel definition layer which protrudes beyond the first portions to define the pixel opening regions.

In another aspect, the present disclosure provides in some embodiments an OLED display substrate manufactured through the above-mentioned method.

In yet another aspect, the present disclosure provides in some embodiments a display device including the above-mentioned OLED display substrate.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

Figure 1:
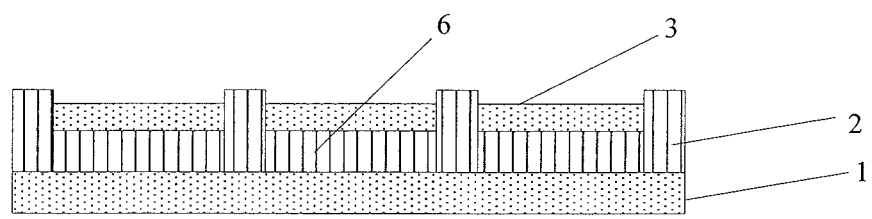
FIG. 1 is a schematic view showing an OLED display substrate after the formation of a second transparent conductive pattern, pixel definition layer transition patterns and third transparent conductive patterns according to one embodiment of the present disclosure.

A light beam generated by a top-emission OLED exits at a side away from a base substrate, so an anode located at a side adjacent to the base substrate may be made of a high-reflective material, and a commonly-used reflective anode may have a structure of indium tin oxide (ITO)/ aluminium (Al)/ITO, or ITO/argentum (Ag)/ITO. Currently, during the manufacture of a pixel definition layer of a top-emission OLED display panel, after the formation of the reflective anode (e.g., ITO/Al/ITO), an organic material is applied onto the reflective anode so as to form the pixel definition layer. The pixel definition layer includes pixel opening regions and bank regions. Usually, a manufacture process of the pixel definition layer includes applying the organic material, exposing, developing and curing. Each pixel opening region is a region where the organic material is removed, and each bank region is a region where the organic material is reserved. Due to the formation of the pixel definition layer through the organic material, a large quantity of organic solvents needs to be adopted, resulting in environmental pollution. In addition, the organic material for forming the pixel definition layer is expensive, and the manufacture process of the pixel definition layer is complex, so the production cost of an OLED display panel may increase.

In order to make the objects, the technical solutions and the advantages of the present disclosure more apparent, the present disclosure will be described hereinafter in a clear and complete manner in conjunction with the drawings and embodiments.

An object of the present disclosure is to provide an OLED display substrate, a method for manufacturing the OLED display substrate and a display device, so as to simplify the manufacture process of the OLED display substrate, and reduce the manufacture cost of the OLED display substrate.

The present disclosure provides in some embodiments a method for manufacturing an OLED display substrate, which includes: forming pixel definition layer transition patterns with metal; and oxidizing the pixel definition layer transition patterns to form an insulative pixel definition layer.

According to the embodiments of the present disclosure, the pixel definition layer transition patterns may be made of metal, and then oxidized so as to form the insulative pixel definition layer. In other words, the pixel definition layer may be made of an inorganic material rather than an organic material. As compared with the related art where the pixel definition layer is made of an organic material after the formation of a reflective anode, it is able to reduce the quantity of the organic material, thereby to reduce the production cost and simplify the manufacture process. In addition, it is able to reduce the quantity of organic solvents, thereby to prevent the environmental pollution.

In a possible embodiment of the present disclosure, the forming the pixel definition layer transition patterns with metal may include forming the pixel definition layer transition patterns and at least a part of an anode with metal through a one-step patterning process. In this way, it is able to reduce the number of times of patterning processes for the OLED display substrate, thereby to reduce the production cost.

In the embodiments of the present disclosure, when the OLED display substrate is a top-emission OLED display substrate, the anode of the OLED display substrate maybe made of a high-reflective material. To be specific, the anode may be of a multiple-layered structure, such as a triple-layered structure consisting of a transparent conductive layer, a metal layer and a transparent conductive layer from a top layer to a bottom layer (e.g., ITO/Al/ITO or ITO/Ag/ ITO). The transparent conductive layer at the bottom layer of the anode (e.g., an ITO layer) may function as to increase the adhesivity of an upper-layer thin film, an intermediate metal layer may mainly function as to reflect a light beam generated by an OLED, and the transparent conductive layer at the top layer of the anode (e.g., an ITO layer) may mainly function as to reduce a work function difference between an electrode and a light-emitting layer of the OLED. In the embodiments of the present disclosure, the pixel definition layer may be formed through the metal layer (i.e., an Al layer) of the reflective anode (e.g., ITO/Al/ITO) in the top-emission OLED display substrate. To be specific, a part of the metal layer may be oxidized through anodic oxidation or thermal oxidization, so as to form a metal oxide layer. The resultant metal oxide layer is insulative, so it may be adopted to form the pixel definition layer. A non-oxidized portion of the metal layer, as a bank for the pixel definition layer may form the anode together with the upper transparent conductive layer (e.g., an ITO layer).

In a possible embodiment of the present disclosure, the forming the pixel definition layer transition patterns and at least a part of the anode with metal may include: forming a metal layer; and patterning the metal layer to form a first metal pattern and a plurality of metal banks arranged on the first metal pattern, spaced apart from each other and defining a plurality of pixel opening regions. The first metal pattern may be a part of the anode, and the metal banks may be the pixel definition layer transition patterns.

In a possible embodiment of the present disclosure, the forming the pixel definition layer transition patterns and at least a part of the anode with metal may further include, prior to forming the metal layer, forming a second transparent conductive pattern. An orthogonal projection of the second transparent conductive pattern onto a plane where the first metal pattern is located coincides with the first metal pattern.

In a possible embodiment of the present disclosure, the forming the pixel definition layer transition patterns and at least a part of the anode with metal may further include, subsequent to forming the metal layer, forming third transparent conductive patterns in the pixel opening regions respectively.

In another possible embodiment of the present disclosure, the forming the pixel definition layer transition patterns and at least a part of the anode with metal may include: forming a metal layer; and patterning the metal layer to form a first metal pattern including first portions of the anode and the pixel definition layer transition patterns. The first portions and the pixel definition layer transition patterns may be arranged alternately, and an upper surface of each first portion may be flush with an upper surface of each pixel definition layer transition pattern.

In a possible embodiment of the present disclosure, the forming the pixel definition layer transition patterns and at least a part of the anode with metal may further include, prior to forming the metal layer, forming a second transparent conductive pattern. An orthogonal projection of the second transparent conductive pattern onto a plane where the first metal pattern is located may coincide with the first metal pattern.

In a possible embodiment of the present disclosure, the forming the pixel definition layer transition patterns and at least a part of the anode with metal may further include, subsequent to forming the metal layer, forming third transparent conductive patterns on the first portions. The oxidizing the pixel definition layer transition patterns to form the insulative pixel definition layer may include oxidizing each pixel definition layer transition pattern no covered by the corresponding third transparent conductive pattern to acquire the insulative pixel definition layer which protrudes beyond the first portions to define the pixel opening regions.

Figure 2:
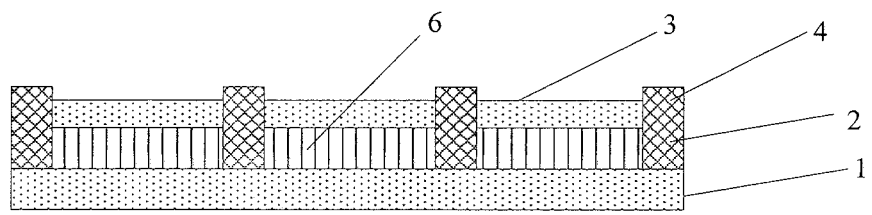
FIG. 2 is a schematic view showing the OLED display substrate after the formation of a pixel definition layer by oxidizing the pixel definition layer transition patterns according to one embodiment of the present disclosure.

In a possible embodiment of the present disclosure, as shown in FIGS. 1-2, the method may specifically include the following steps.

Step 1: as shown in FIG. 1, an ITO layer may be deposited as the second transparent conductive pattern 1 through a magnetron sputtering device, and the metal layer (e.g., an Al layer) may be deposited through the magnetron sputtering device and then patterned to form metal layer reserved portions and metal layer partially-reserved portions 6. Each metal layer reserved portion may form the bank protruding beyond the corresponding metal layer partially-reserved portion 6. The metal layer reserved portions may be adopted to define the plurality of pixel opening regions and serve as the pixel definition layer transition patterns 2.

Step 2: as shown in FIG. 1, an ITO layer may be deposited as the third transparent conductive pattern 3 in each pixel opening region defined by the pixel definition layer transition patterns 2. The second transparent conductive pattern 1, the metal layer partially-reserved portions 6 and the third transparent conductive patterns 3 may together form the anode of the OLED display substrate.

Each metal layer partially-reserved portion 6 and each third transparent conductive pattern 3 may be merely arranged in the corresponding pixel opening region. The second transparent conductive pattern 1 may be separately arranged in each pixel opening region, or it may, as a whole, correspond to the plurality of pixel opening regions and the pixel definition layer transition patterns. When the second transparent conductive pattern 1 corresponds to the plurality of pixel opening regions and the pixel definition layer transition patterns, a cathode of the OLED display substrate shall be separately arranged in each pixel opening region rather than as an entire surface, so as to separately drive a light-emitting layer in each pixel opening region.

Step 3: as shown in FIG. 2, each pixel definition layer transition pattern 2 may be oxidized to acquire an insulative metal oxide layer as the pixel definition layer 4. The pixel definition layer 4 may define the plurality of pixel opening regions.

Each pixel definition layer transition pattern 2 may be oxidized through, but not limited to, thermal oxidization. The oxidization of the metal layer is known in the art, and thus will not be particularly defined herein.

According to the embodiments of the present disclosure, the pixel definition layer transition patterns may be made of metal, and then oxidized so as to form the insulative pixel definition layer. In other words, the pixel definition layer may be made of an inorganic material rather than an organic material. As compared with the related art where the pixel definition layer is made of an organic material after the formation of a reflective anode, it is able to reduce the quantity of the organic material, thereby to reduce the production cost and simplify the manufacture process. In addition, it is able to reduce the quantity of organic solvents, thereby to prevent the environmental pollution.

Figure 3:
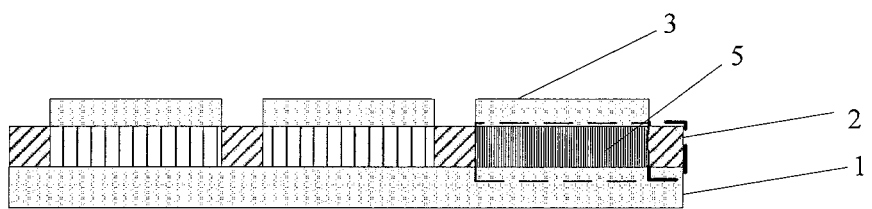
FIG. 3 is a schematic view showing the OLED display substrate after the formation of the third transparent con-

In another possible embodiment of the present disclosure, as shown in FIGS. 2 and 3, the method for manufacturing the OLED display substrate may include the following steps.

Step 1: as shown in FIG. 3, an ITO layer may be deposited as the second transparent conductive pattern 1 through a magnetron sputtering device, and the metal layer (e.g., an Al layer) may be deposited through the magnetron sputtering device and then patterned to form a metal layer pattern consisting of the first portions 5 and the pixel definition layer transition patterns 2 arranged alternately. The first portions 5 may form a part of the anode, and an upper surface of each first portion 5 may be flush with an upper surface of each pixel definition layer transition pattern 2.

Step 2: as shown in FIG. 3, the third transparent conductive patterns 3 may be formed on the first portions 5 respectively. The second transparent conductive pattern 1, the first portions 5 and the third transparent conductive patterns 3 may together form the anode of the OLED display substrate.

Each first portion 5 and each third transparent conductive pattern 3 may be merely arranged in the corresponding pixel opening region. The second transparent conductive pattern 1 may be separately arranged in each pixel opening region, or it may, as a whole, correspond to the plurality of pixel opening regions and the pixel definition layer transition patterns. When the second transparent conductive pattern 1 corresponds to the plurality of pixel opening regions and the pixel definition layer transition patterns, a cathode of the OLED display substrate shall be separately arranged in each pixel opening region rather than as an entire surface, so as to separately drive a light-emitting layer in each pixel opening region.

Step 3: as shown in FIG. 2, as shown in FIG. 2, each pixel definition layer transition pattern 2 may be oxidized to acquire an insulative metal oxide layer as the pixel definition layer 4. During the oxidization, an oxidization parameter may be adjusted so as to increase a thickness of the pixel definition layer transition pattern 2, and enable the pixel definition layer transition pattern 2 to protrude beyond the corresponding first portion 5. The pixel definition layer 4 acquired after the oxidization may define the plurality of pixel opening regions.

Each pixel definition layer transition pattern 2 may be oxidized through, but not limited to, thermal oxidization or anodic oxidization. Anodic oxidization parameters may include, but not limited to, oxidization time, voltage and current. The oxidization of the metal layer is known in the art, and thus will not be particularly defined herein.

According to the embodiments of the present disclosure, the pixel definition layer transition patterns may be made of metal, and then oxidized so as to form the insulative pixel definition layer. In other words, the pixel definition layer may be made of an inorganic material rather than an organic material. As compared with the related art where the pixel definition layer is made of an organic material after the formation of a reflective anode, it is able to reduce the quantity of the organic material, thereby to reduce the production cost and simplify the manufacture process. In addition, it is able to reduce the quantity of organic solvents, thereby to prevent the environmental pollution.

The present disclosure further provides in some embodiments an OLED display substrate manufactured through the above-mentioned method.

According to the embodiments of the present disclosure, the pixel definition layer transition patterns may be made of metal, and then oxidized so as to form the insulative pixel definition layer. In other words, the pixel definition layer may be made of an inorganic material rather than an organic material. As compared with the related art where the pixel definition layer is made of an organic material after the formation of a reflective anode, it is able to reduce the quantity of the organic material, thereby to reduce the production cost and simplify the manufacture process. In addition, it is able to reduce the quantity of organic solvents, thereby to prevent the environmental pollution.

The present disclosure further provides in some embodiments a display device including the above-mentioned OLED display substrate. The display substrate may be any product or member having a display function, e.g., television, display, digital photo frame, mobile phone or flat-panel computer. The display device may further include a flexible circuit board, a printed circuit board and a back plate.

According to the embodiments of the present disclosure, the pixel definition layer transition patterns may be made of metal, and then oxidized so as to form the insulative pixel definition layer. In other words, the pixel definition layer may be made of an inorganic material rather than an organic material. As compared with the related art where the pixel definition layer is made of an organic material after the formation of a reflective anode, it is able to reduce the production cost, simplify the manufacture process, and prevent the environmental pollution.

In the embodiments of the present disclosure, the order of the steps is not limited to the serial numbers thereof. For a person skilled in the art, any change in the order of the steps shall also fall within the scope of the present disclosure if without any creative effort.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An OLED display substrate, comprising:
   an anode;
   wherein the anode comprises a second transparent conductive pattern, and the second transparent conductive pattern, as a whole, correspond to a plurality of pixel opening regions;
   the anode comprises a metal layer, and the metal layer comprises a first portions and a pixel definition layer transition patterns arranged alternately;
   the anode further comprises a third transparent conductive pattern, the first portion and the third transparent conductive pattern are arranged in the corresponding pixel opening region;
   a projection of the pixel defining layer transition pattern on the second transparent conductive pattern and a projection of the pixel opening region on the second transparent conductive pattern do not overlap;
   the OLEO display substrate further comprises a pixel defining layer that is acquired by oxidizing the pixel defining layer transition pattern.

2. The OLED display substrate according to claim 1, wherein the pixel definition layer transition patterns and the at least a part of anode comprise a metal layer, the metal layer comprises a first metal pattern and a plurality of metal banks arranged on the first metal pattern, spaced apart from each other and defining a plurality of pixel opening regions, the first metal pattern is a part of the anode, and the metal banks are the pixel definition layer transition patterns.

3. The OLED display substrate according to claim 2, wherein the anode further comprises a second transparent conductive pattern, and an orthogonal projection of the second transparent conductive pattern onto a plane where the first metal pattern is located coincides with the first metal pattern.

4. The OLED display substrate according to claim 2, wherein the anode further comprises third transparent conductive patterns arranged in the pixel opening regions.

5. The OLED display substrate according to claim 1, wherein the pixel definition layer transition patterns and the at least a part of the anode comprise a metal layer, the metal layer comprises a first metal pattern consisting of first portions for forming the anode and the pixel definition layer transition patterns, the first portions and the pixel definition layer transition patterns are arranged alternately, and an upper surface of each first portion is flush with an upper surface of each pixel definition layer transition pattern.

6. The OLED display substrate according to claim 5, wherein the anode further comprises a second transparent conductive pattern, and an orthogonal projection of the second transparent conductive pattern onto a plane where the first metal pattern is located coincides with the first metal pattern.

7. The OLED display substrate according to claim 5, wherein the anode further comprises third transparent conductive patterns; the pixel definition layer transition patterns are insulating oxides, after is oxidized protrudes beyond the first portions and defines the plurality of pixel opening regions.

8. A display device, comprising the OLED display substrate according to claim 1.

9. The OLED display substrate according to claim 1, wherein an upper surface of at least a part of the anode is flush with an upper surface of each pixel definition layer transition pattern.

* * * * *